(12) United States Patent
Liu et al.

(10) Patent No.: US 7,160,432 B2
(45) Date of Patent: *Jan. 9, 2007

(54) METHOD AND COMPOSITION FOR POLISHING A SUBSTRATE

(75) Inventors: Feng Q. Liu, San Jose, CA (US); Liang-Yuh Chen, Foster City, CA (US); Stan D. Tsai, Fremont, CA (US); Alain Duboust, Sunnyvale, CA (US); Siew S. Neo, Santa Clara, CA (US); Yongqi Hu, Campbell, CA (US); Yan Wang, Sunnyvale, CA (US); Paul D. Butterfield, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 317 days.

This patent is subject to a terminal disclaimer.

(21) Appl. No.: 10/608,404

(22) Filed: Jun. 26, 2003

(65) Prior Publication Data

US 2004/0053499 A1 Mar. 18, 2004

Related U.S. Application Data

(63) Continuation-in-part of application No. 10/456,220, filed on Jun. 6, 2003, and a continuation-in-part of application No. 10/378,097, filed on Feb. 26, 2003, and a continuation-in-part of application No. 10/038,066, filed on Jan. 3, 2002, now Pat. No. 6,811,680, and a continuation-in-part of application No. 10/032,275, filed on Dec. 21, 2001, now Pat. No. 6,899,804.

(60) Provisional application No. 60/359,746, filed on Feb. 26, 2002, provisional application No. 60/275,874, filed on Mar. 14, 2001.

(51) Int. Cl.
*B23H 5/08* (2006.01)

(52) U.S. Cl. ............ 205/647; 205/662; 205/682
(58) Field of Classification Search ............ 205/662, 205/647, 682
See application file for complete search history.

(56) References Cited

U.S. PATENT DOCUMENTS 2,582,020 A 1/1952 Emery .................. 204/140.5
3,239,441 A 3/1966 Marosi (Continued)

FOREIGN PATENT DOCUMENTS

EP 0 527 537 2/1993

(Continued)

OTHER PUBLICATIONS

PCT International Preliminary Examination Report for PCT/US02/04806, dated Sep. 7, 2004.

(Continued)

*Primary Examiner*—Roy King
*Assistant Examiner*—Michael P. Alexander
(74) *Attorney, Agent, or Firm*—Patterson and Sheridan

(57) ABSTRACT

Polishing compositions and methods for removing conductive materials from a substrate surface are provided. In one aspect, a method is provided for processing a substrate to remove conductive material disposed over narrow feature definitions formed in a substrate at a higher removal rate than conductive material disposed over wide feature definitions formed in a substrate by an electrochemical mechanical polishing technique. The electrochemical mechanical polishing technique may include a polishing composition comprising an acid based electrolyte system, one or more chelating agents, one or more corrosion inhibitors, one or more inorganic or organic acid salts, one or more pH adjusting agents to provide a pH between about 2 and about 10, and a solvent.

34 Claims, 4 Drawing Sheets

U.S. PATENT DOCUMENTS

| | | | |
|---|---|---|---|
| 3,873,512 A | 3/1975 | Latanision | 204/129.46 |
| 4,263,113 A | 4/1981 | Bernard | 204/146 |
| 4,369,099 A * | 1/1983 | Kohl et al. | 205/646 |
| 4,663,005 A | 5/1987 | Edson | 204/129.85 |
| 4,666,683 A | 5/1987 | Brown et al. | |
| 4,793,895 A | 12/1988 | Kaanta et al. | |
| 4,941,082 A | 7/1990 | Edson | |
| 4,992,135 A | 2/1991 | Doan | |
| 5,002,645 A | 3/1991 | Eastland et al. | |
| 5,096,550 A | 3/1992 | Mayer et al. | 204/129.1 |
| 5,114,548 A | 5/1992 | Rhoades | |
| 5,129,981 A | 7/1992 | Wang et al. | 156/628 |
| 5,209,816 A | 5/1993 | Yu et al. | |
| 5,217,586 A | 6/1993 | Datta et al. | 204/129.6 |
| 5,225,034 A | 7/1993 | Yu et al. | 156/636 |
| 5,256,565 A | 10/1993 | Bernhardt et al. | 437/228 |
| 5,340,370 A | 8/1994 | Cadien et al. | |
| 5,391,258 A | 2/1995 | Brancaleoni et al. | |
| 5,407,526 A | 4/1995 | Danielson et al. | |
| 5,534,106 A | 7/1996 | Cote et al. | 156/636.1 |
| 5,543,032 A | 8/1996 | Datta et al. | |
| 5,567,300 A | 10/1996 | Datta et al. | 205/652 |
| 5,575,706 A | 11/1996 | Tsai et al. | 451/41 |
| 5,770,095 A | 6/1998 | Sasaki et al. | |
| 5,783,489 A | 7/1998 | Kaufman et al. | |
| 5,807,165 A | 9/1998 | Uzoh et al. | 451/41 |
| 5,843,032 A | 12/1998 | Kastenhofer | |
| 5,846,882 A | 12/1998 | Birang | |
| 5,866,031 A | 2/1999 | Carprio et al. | 252/79.1 |
| 5,880,003 A | 3/1999 | Hayashi | |
| 5,897,375 A | 4/1999 | Watts et al. | |
| 5,911,619 A | 6/1999 | Uzoh et al. | 451/5 |
| 5,954,997 A | 9/1999 | Kaufman et al. | 252/79.1 |
| 6,001,730 A | 12/1999 | Farkas et al. | |
| 6,004,880 A | 12/1999 | Liu et al. | 438/692 |
| 6,007,630 A | 12/1999 | Datta | |
| 6,056,864 A | 5/2000 | Cheung | 205/222 |
| 6,063,306 A | 5/2000 | Kaufman et al. | |
| 6,066,030 A | 5/2000 | Uzoh | 451/41 |
| 6,077,412 A | 6/2000 | Ting et al. | 205/143 |
| 6,083,840 A | 7/2000 | Mravic et al. | |
| 6,090,239 A | 7/2000 | Liu et al. | 156/345 |
| 6,096,652 A | 8/2000 | Watts et al. | 438/692 |
| 6,099,604 A | 8/2000 | Sandhu et al. | |
| 6,103,096 A | 8/2000 | Datta | |
| 6,116,785 A | 9/2000 | Kondo et al. | |
| 6,117,775 A | 9/2000 | Kondo et al. | 438/690 |
| 6,117,783 A | 9/2000 | Small et al. | |
| 6,117,853 A | 9/2000 | Sakai et al. | 514/78 |
| 6,126,853 A | 10/2000 | Kaufman et al. | 252/79.1 |
| 6,143,155 A | 11/2000 | Adams et al. | 205/87 |
| 6,143,656 A | 11/2000 | Yang et al. | 438/687 |
| 6,153,043 A | 11/2000 | Edelstein et al. | 156/345 |
| 6,171,352 B1 | 1/2001 | Lee et al. | |
| 6,176,992 B1 | 1/2001 | Talieh | |
| 6,177,026 B1 | 1/2001 | Wang et al. | 252/79.1 |
| 6,190,237 B1 | 2/2001 | Huyng et al. | 451/41 |
| 6,194,317 B1 | 2/2001 | Kaisaki et al. | 438/692 |
| 6,206,756 B1 | 3/2001 | Chopra et al. | |
| 6,217,416 B1 | 4/2001 | Kaufman et al. | 451/41 |
| 6,218,305 B1 | 4/2001 | Hosali et al. | 438/691 |
| 6,234,870 B1 | 5/2001 | Uzoh et al. | 451/8 |
| 6,238,592 B1 | 5/2001 | Hardy et al. | |
| 6,248,222 B1 | 6/2001 | Wang | |
| 6,258,711 B1 | 7/2001 | Laursen et al. | |
| 6,258,721 B1 | 7/2001 | Li et al. | |
| 6,273,786 B1 | 8/2001 | Chopra et al. | |
| 6,276,996 B1 | 8/2001 | Chopra | 451/41 |
| 6,303,049 B1 | 10/2001 | Lee et al. | |
| 6,303,551 B1 | 10/2001 | Li et al. | |
| 6,310,019 B1 | 10/2001 | Kakizawa et al. | |
| 6,315,803 B1 | 11/2001 | Ina et al. | |
| 6,315,883 B1 * | 11/2001 | Mayer et al. | 205/123 |
| 6,348,076 B1 | 2/2002 | Canaperi et al. | 51/309 |
| 6,354,916 B1 | 3/2002 | Uzoh et al. | |
| 6,355,075 B1 | 3/2002 | Ina et al. | |
| 6,355,153 B1 | 3/2002 | Uzoh et al. | |
| 6,375,693 B1 | 4/2002 | Cote et al. | |
| 6,391,166 B1 | 5/2002 | Wang | 204/224 R |
| 6,395,152 B1 | 5/2002 | Wang | 204/224 M |
| 6,416,685 B1 | 7/2002 | Zhang et al. | |
| 6,419,554 B1 | 7/2002 | Chopra et al. | |
| 6,428,721 B1 | 8/2002 | Ina et al. | |
| 6,429,133 B1 | 8/2002 | Chopra | |
| 6,440,186 B1 | 8/2002 | Sakai et al. | |
| 6,440,295 B1 | 8/2002 | Wang | 205/640 |
| 6,447,371 B1 | 9/2002 | Brusic Kaufman et al. | |
| 6,447,668 B1 * | 9/2002 | Wang | 205/645 |
| 6,454,819 B1 | 9/2002 | Yano et al. | |
| 6,455,479 B1 | 9/2002 | Sahbari | |
| 6,508,952 B1 | 1/2003 | Lee et al. | |
| 6,541,384 B1 | 4/2003 | Sun et al. | |
| 6,551,935 B1 | 4/2003 | Sinha et al. | |
| 6,555,158 B1 | 4/2003 | Yoshio et al. | |
| 6,562,719 B1 | 5/2003 | Kondo et al. | |
| 6,565,619 B1 | 5/2003 | Asano et al. | |
| 6,579,153 B1 | 6/2003 | Uchikura et al. | |
| 6,593,239 B1 | 7/2003 | Kaufman et al. | |
| 6,596,152 B1 * | 7/2003 | Yang et al. | 205/640 |
| 6,596,638 B1 | 7/2003 | Kondo et al. | |
| 6,602,112 B1 | 8/2003 | Tran et al. | |
| 6,605,537 B1 | 8/2003 | Bian et al. | |
| 6,616,976 B1 | 9/2003 | Montano et al. | |
| 6,620,215 B1 | 9/2003 | Li et al. | |
| 6,653,242 B1 | 11/2003 | Sun et al. | |
| 6,676,484 B1 | 1/2004 | Chopra | |
| 6,679,928 B1 | 1/2004 | Costas et al. | |
| 6,679,929 B1 | 1/2004 | Asano et al. | |
| 6,693,036 B1 | 2/2004 | Nogami et al. | |
| 6,699,299 B1 | 3/2004 | Sanchan et al. | |
| 6,736,952 B1 * | 5/2004 | Emesh et al. | 205/81 |
| 6,811,680 B1 * | 11/2004 | Chen et al. | 205/662 |
| 6,893,476 B1 | 5/2005 | Siddiqui et al. | |
| 2001/0016469 A1 | 8/2001 | Chopra | |
| 2001/0024878 A1 | 9/2001 | Nakamura | |
| 2001/0036746 A1 | 11/2001 | Sato et al. | 438/745 |
| 2001/0042690 A1 | 11/2001 | Talieh | |
| 2001/0052351 A1 | 12/2001 | Brown et al. | |
| 2002/0008036 A1 | 1/2002 | Wang | 205/118 |
| 2002/0016064 A1 | 2/2002 | Komai et al. | |
| 2002/0016272 A1 | 2/2002 | Kakizawa et al. | |
| 2002/0040100 A1 | 4/2002 | Kume et al. | 525/89 |
| 2002/0070126 A1 | 6/2002 | Sato et al. | |
| 2002/0072309 A1 | 6/2002 | Sato et al. | |
| 2002/0074230 A1 | 6/2002 | Basol | |
| 2002/0088709 A1 * | 7/2002 | Hongo et al. | 204/223 |
| 2002/0096659 A1 | 7/2002 | Sakai et al. | |
| 2002/0104764 A1 | 8/2002 | Banerjee et al. | |
| 2002/0108861 A1 | 8/2002 | Emesh et al. | |
| 2002/0108864 A1 | 8/2002 | Yang et al. | |
| 2002/0130049 A1 | 9/2002 | Chen et al. | |
| 2002/0139055 A1 | 10/2002 | Asano et al. | |
| 2002/0160698 A1 | 10/2002 | Sato et al. | |
| 2002/0182982 A1 | 12/2002 | Li et al. | |
| 2003/0073311 A1 | 4/2003 | Levert et al. | |
| 2003/0073386 A1 | 4/2003 | Ma et al. | |
| 2003/0079416 A1 | 5/2003 | Ma et al. | |
| 2003/0083214 A1 | 5/2003 | Kakizawa et al. | |
| 2003/0104762 A1 | 6/2003 | Sato et al. | |
| 2003/0113996 A1 | 6/2003 | Nogami et al. | |
| 2003/0114004 A1 | 6/2003 | Sato et al. | |
| 2003/0115475 A1 | 6/2003 | Russo et al. | |
| 2003/0116445 A1 | 6/2003 | Sun et al. | 205/674 |
| 2003/0116446 A1 | 6/2003 | Duboust et al. | |

| | | |
|---|---|---|
| 2003/0136055 A1 | 7/2003 | Li et al. |
| 2003/0153184 A1 | 8/2003 | Wang et al. |
| 2003/0170091 A1 | 9/2003 | Shomler et al. |
| 2003/0178320 A1 | 9/2003 | Liu et al. |
| 2003/0216045 A1 | 11/2003 | Wang et al. |
| 2003/0234184 A1 | 12/2003 | Liu et al. |
| 2004/0053499 A1 | 3/2004 | Liu et al. |
| 2004/0144038 A1 | 7/2004 | Siddiqui |
| 2004/0248412 A1 | 12/2004 | Liu et al. |
| 2005/0044803 A1 | 3/2005 | Siddiqui et al. |
| 2005/0565378 | 3/2005 | Chen et al. |
| 2005/0076578 A1 | 4/2005 | Siddiqui et al. |
| 2005/0076579 A1 | 4/2005 | Siddiqui et al. |
| 2005/0079718 A1 | 4/2005 | Siddiqui et al. |
| 2005/0079803 A1 | 4/2005 | Siddiqui et al. |
| 2005/0145507 A1 | 7/2005 | Sun et al. |
| 2005/0218010 A1 | 10/2005 | Wang et al. |

FOREIGN PATENT DOCUMENTS

| | | |
|---|---|---|
| EP | 0 699 782 | 3/1996 |
| EP | 0 811 665 A3 | 12/1997 |
| EP | 0 846 742 A2 | 6/1998 |
| EP | 1 103 346 A2 | 5/2001 |
| EP | 1 167 585 | 1/2002 |
| EP | 1 170 761 A1 | 9/2002 |
| JP | 58-093886 | 6/1983 |
| JP | 58-093899 | 6/1983 |
| JP | 05 302199 | 11/1993 |
| JP | 06 158397 | 6/1994 |
| JP | 10 121297 | 5/1998 |
| JP | 2000 192298 | 7/2000 |
| JP | 2000 256898 | 9/2000 |
| JP | 01-77117 | 3/2001 |
| WO | 98/04646 | 2/1998 |
| WO | 98/49723 | 11/1998 |
| WO | WO 99/46353 | 9/1999 |
| WO | 99/53532 | 10/1999 |
| WO | 99/65072 | 12/1999 |
| WO | 00/03426 | 1/2000 |
| WO | 00/26443 | 5/2000 |
| WO | 02/7241 A2 | 10/2001 |
| WO | WO 01/77241 | 10/2001 |
| WO | 02/23616 | 3/2002 |
| WO | WO 02/23616 | 3/2002 |
| WO | 02/075804 A2 | 9/2002 |
| WO | WO 02/75804 | 9/2002 |
| WO | 02/88229 | 11/2002 |
| WO | WO 02/88229 | 11/2002 |
| WO | WO 03/060962 A2 | 7/2003 |
| WO | WO 03/72672 | 8/2003 |

OTHER PUBLICATIONS

PCT International Preliminary Examination Report for PCT/US03/06058, dated Sep. 7, 2004.

PCT International Search Report for PCT/US04/17691, dated Nov. 11, 2004.

PCT Written Opinion for PCT/US04/17691, dated Nov. 11, 2004.

PCT Written Opinion for PCT/US02/04806, dated Mar. 9, 2004.

PCT Written Opinion for PCT/US03/06058, dated Feb. 13, 2004.

Nogami, "An Innovation to Integrate Porous Low-K Materials and Copper", InterConnect Japan 2001; Honeywell Seminar (Dec. 6, 2001) pp. 1-12.

D. Landolt, "Fundamental Aspects of Electropolishing", Mar. 18, 1996, pp.: 1-11.

Robert J. Contolini, "Electrochemical Planarization of ULSI Copper" Jun. 1997, Solid State Technology, pp. 155-156, 158 and 160.

Partial International Search Report for US 02/40754 dated Apr. 28, 2003.

International Search Report for US 02/04806 dated Apr. 1, 2003.

PCT International Search Report for US 03/06058 dated Jun. 25, 2003.

Deshpande, et al., "Chemical Mechanical Planarization of Copper: Role of Oxidants and Inhibitors", Journal of The Electrochemical Society, pp. G788-G794 (2004).

Economikos, et al., "Integrated Electro-Chemical Mechanical Planarization (Ecmp) for Future Generation Device Technology", 2004 IEEE, pp. 233-235.

Goonetilleke, et al., "Voltage-Induced Material Removal for Electrochemical Mechanical Planarization of Copper in Electrolytes Containing $NO_3^-$, Glycine, and $H_2O_2$, Electrochemical and Solid-State Letters, pp. G190-G193 (2005).

Steigerwald, et al., "Effect of Copper Ions in the Slurry on the Chemical-Mechanical Polish Rate of Titanium", J. Electrochem. Soc., vol. 141, No. 12, Dec. 1994, pp. 3512-3516.

International Search Report for PCT/US02/40754 dated Aug. 5, 2003.

PCT International Search Report for PCT/US04/17691, dated Nov. 16, 2004.

PCT Written Opinion for PCT/US04/17691, dated Nov. 16, 2004.

Besser et al., "Mechanical Strain Evolution in Cu/low K Interconnect Lines", Mat. Res. Soc. Symp. Proc. vol. 795, 2004 Materials Research Society, pp. U1.1.1-U1.1.6.

Chandrasekaran, et al., "Effects of CMP Process Conditions on Defect Generation in Low-k Materials", Journal of The Electrochemical Society, pp. G882-G889 (2004).

Chang, et al., "Microleveling Mechanisms and Applications of Electropolishing of Planarization of Copper Mettalization", J. Vac. Sci. Technol. B 20(5), Sep./Oct. 2002, pp. 2149-2152.

Chang, et al., "Superpolishing of Planarizing Copper Damascene Interconnects", Electrochemical and Solid-State Letters, pp. G72-G74 (2003).

Contolini, et al., "Electrochemical Planarization for Multilevel Metallization", J. Electrochem. Soc., vol. 141, No. 9, Sep. 1994, pp. 2503-2510.

Du, et al., Mechanism of Copper Removal During CMP in Acidic $H_2O_2$ Slurry, Journal of The Electrochemical Society, pp. G230-G235 (2004).

Hu, et al. "Copper Interconnection Integration and Reliability", Thin Solid State Films, pp. 84-92, (1995).

Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", Electrochimica Acta, vol. 43, Nos. 3-4, pp. 265-274, 1998.

Kaufman, et al., "Chemical-Mechanical Polishing for Fabricating Patterned W Metal Features as Chip Interconnects", J. Electrochem. Soc., vol. 138, No. 11, Nov. 1991; The Electrochemical Society, Inc. pp. 3460-3465.

Kondo, et al., "Role of Additives for Copper Damascene Electrodeposition: Experimental Study on Inhibition and Acceleration Effects", Journal of The Electrochemical Society, pp. C250-C255 (2004).

Padhi, et al., "Planarization of Copper Thin Films by Electropolishing in Phosphoric Acid for ULSI Applications", Journal of the Electrochemical Society, 150, pp. G10-G14 (2003).

Qafsaoui, et al., "Quantitative Characterization of Protective Films Grown on Copper in the Presence of Different Triazole Derivative Inhibitors", Electrochimica Acta 47 (2002), pp. 4339-4346.

Tamilmani, et al., "Potential-pH Diagrams of Interest to Chemical Mechanical Planarization of Copper", Journal of The Electrochemical Society, V. 149, pp. G638-G642 (2002).

Tromans, et al., "Growth of Passivating CuBTA Films on Copper in Aqueous Chloride/Benzotriazole Solutions'", Electrochemical and Solid-State Letter, V. 5, pp. B5-B8 (2002).

Wang, et al., "Inhibition Effect of AC-Treated, Mixed Self-Assembled Film of Phenylthiourea and 1-Dodecanethiol on Copper Corrosion", Journal of The Electrochemical Society, pp. B11-B15 (2004).

* cited by examiner

METHOD AND COMPOSITION FOR POLISHING A SUBSTRATE

CROSS-REFERENCE TO RELATED APPLICATIONS

This application is a continuation-in-part of U.S. patent application Ser. No. 10/038,066, filed Jan. 3, 2002 now U.S. Pat. No. 6,811,680, entitled "Planarization Of Substrates Using Electrochemical Mechanical Polishing", that claims priority to U.S. Provisional Patent Application Ser. No. 60/275,874, filed on Mar. 14, 2001, a continuation-in-part of U.S. patent application Ser. No. 10/032,275, filed Dec. 21, 2001 now U.S. Pat. No. 6,899,804, entitled "Electrolyte Composition And Treatment For Electrolytic Chemical Mechanical Polishing", which applications are incorporated by reference herein, a continuation-in-part of co-pending U.S. patent application Ser. No. 10/378,097, filed Feb. 26, 2003, entitled "Method and Composition For Polishing a Substrate", which claims priority to U.S. Provisional Patent Application Ser. No. 60/359,746, filed on Feb. 26, 2002, and a continuation-in-part of co-pending U.S. patent application Ser. No. 10/456,220, filed Jun. 6, 2003, entitled "Method and Composition For Polishing a Substrate".

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor processes.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing article in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing article while dispersing a polishing composition to effect both chemical activity and mechanical activity.

However, materials deposited on the surface of a substrate to fill feature definitions formed therein often result in unevenly formed surfaces over feature definitions of variable density. Referring to FIG. 1A, a metal layer 20 is deposited on a substrate 10 to fill wide feature definitions 30, also known as low density feature definitions, or narrow feature definitions 40, also known as and high density feature definitions. Excess material, called overburden, may be formed with a greater thickness 45 over the narrow feature definitions 40 and may have minimal deposition 35 over wide feature definitions 30. Polishing of surfaces with overburden may result in the retention of residues 50 from inadequate metal removal over narrow features. Overpolishing processes to remove such residues 50 may result in excess metal removal over wide feature definitions 30. Excess metal removal can form topographical defects, such as concavities or depressions known as dishing 55, over wide features, as shown in FIG. 1B.

Dishing of features and retention of residues on the substrate surface are undesirable since dishing and residues may detrimentally affect subsequent processing of the substrate. For example, dishing results in a non-planar surface that impairs the ability to print high-resolution lines during subsequent photolithographic steps and detrimentally affects subsequent surface topography of the substrate, which affects device formation and yields. Dishing also detrimentally affects the performance of devices by lowering the conductance and increasing the resistance of the devices, causing device variability and device yield loss. Residues may lead to uneven polishing of subsequent materials, such as barrier layer materials (not shown) disposed between the conductive material and the substrate surface. Post CMP profiles generally show higher dishing on wide trenches than on narrow trenches or dense areas. Uneven polishing will also increase defect formation in devices and reduce substrate yields.

Therefore, there is a need for compositions and methods for removing conductive material from a substrate that minimizes damage to the substrate during planarization.

SUMMARY OF THE INVENTION

Embodiments of the invention provide compositions and methods for removing conductive materials by an electrochemical mechanical polishing technique. In one aspect, a method is provided for processing a substrate having a conductive material layer disposed thereon including providing the substrate to a process apparatus comprising a first electrode and a second electrode with the substrate in electrical contact with the second electrode, wherein the substrate surface comprises conductive material layer disposed over narrow feature definitions and wide feature definitions, supplying a polishing composition between the first electrode and the substrate, wherein the polishing composition comprises an acid based electrolyte system, one or more chelating agents, greater than about 0.2 wt. % of one or more corrosion inhibitors, one or more inorganic or organic acid salts, one or more pH adjusting agents to provide a pH between greater than about 4.5 and about 7, and a solvent, wherein the polishing composition forms a passivation layer on the conductive material, abrading the passivation layer to expose a portion of the conductive material, applying a bias between the first electrode and the second electrode, and removing conductive material disposed over narrow feature definitions at a higher removal rate than conductive material disposed over wide feature definitions.

In one aspect, a method is provided for processing a substrate having a conductive material layer disposed thereon including providing the substrate to a process apparatus comprising a first electrode and a second electrode with the substrate in electrical contact with the second electrode, wherein the conductive material layer is disposed over narrow feature definitions and wide feature definitions, supplying a polishing composition between the first electrode and the substrate, wherein the polishing composition forms a passivation layer on exposed conductive material, abrading the passivation layer to expose a portion of the conductive material, and applying power by a pulse modulation technique between the first electrode and the second electrode to remove conductive material disposed over narrow feature definitions at a higher removal rate than conductive material disposed over wide feature definitions.

In one embodiment, the polishing composition includes an acid based electrolyte system, one or more chelating agents, one or more corrosion inhibitors, one or more inorganic or organic acid salts, one or more pH adjusting agents to provide a pH between about 2 and about 10, and a solvent. The method further includes forming a protrusion of conductive material over the wide feature definitions. The method also further includes polishing the substrate by at least a chemical mechanical polishing process. The chemical mechanical polishing process may be a chemical mechanical polishing process or a second electrochemical mechanical polishing process.

The electrochemical mechanical polishing process may be performed in a process apparatus, such as a toll having one or more polishing stations adapted for electrochemical mechanical polishing processes. A platen for performing an electrochemical mechanical polishing process may include a polishing article, a first electrode and a second electrode, wherein the substrate is in electrical contact with the second electrode. The electrochemical mechanical polishing process may be performed on a first platen as described herein, the chemical mechanical polishing process may be performed on a conventional chemical mechanical polishing platen, and the second electrochemical mechanical polishing process may be performed on the same or different platen adapted for electrochemical mechanical polishing, such as the second platen as described herein.

In another aspect, a method is provided for processing a substrate having a conductive material layer disposed thereon over narrow feature definitions and wide feature definitions including removing conductive material disposed over narrow feature definitions at a higher removal rate than conductive material disposed over wide feature definitions by an electrochemical mechanical polishing technique and removing conductive material disposed over wide feature definitions at a removal rate greater than or equal to the removal rate of conductive material disposed over narrow feature definitions by at least a chemical mechanical polishing technique. The method may comprise polishing the substrate initially with an electrochemical mechanical process and then with a chemical mechanical polishing process or a second electrochemical mechanical process adapted to remove conductive material disposed over wide feature definitions at a removal rate greater than or equal to the removal rate of conductive material disposed over narrow feature definitions. The second electrochemical mechanical process may have a corrosion inhibitor concentration less than the first electrochemical mechanical process and/or have a pH less than the first electrochemical mechanical process.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide compositions and methods for removing at least a conductive material from a substrate surface. The invention is described below in reference to a planarizing process for the removal of conductive materials from a substrate surface by an electrochemical mechanical polishing (ECMP) technique.

The words and phrases used herein should be given their ordinary and customary meaning in the art by one skilled in the art unless otherwise further defined. Chemical mechanical polishing should be broadly construed and includes, but is not limited to, planarizing a substrate surface using chemical activity and mechanical activity, or a concurrent application of chemical activity and mechanical activity. Electropolishing should be broadly construed and includes, but is not limited to, planarizing a substrate by the application of electrochemical activity. Electrochemical mechanical polishing (ECMP) should be broadly construed and includes, but is not limited to, planarizing a substrate by the application of a combination of electrochemical, chemical, and mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each electrolyte component in polishing compositions can be measured in volume percent or weight percent. Volume percent refers to a percentage based on volume of a desired liquid component divided by the total volume of all of the liquid in the complete composition. A percentage based on weight percent is the weight of the desired component divided by the total weight of all of the liquid components in the complete composition. Abrading and abrasion should be broadly construed and includes, but is not limited to, contacting a material and displacing, disturbing, or removing all or a portion of a material.

One Apparatus Embodiment

Figure 1A:
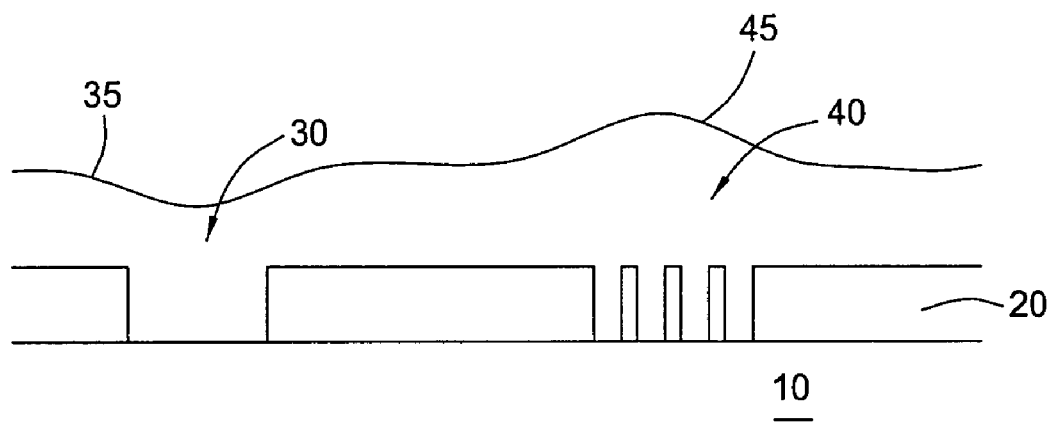
FIGS. 1A–1B are schematic cross-sectional views illustrating a polishing process performed on a substrate according to conventional processes.
Figure 1B:
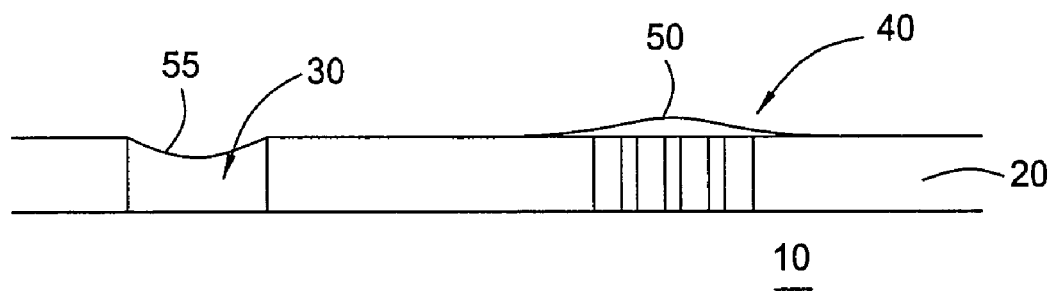
Figure 2:
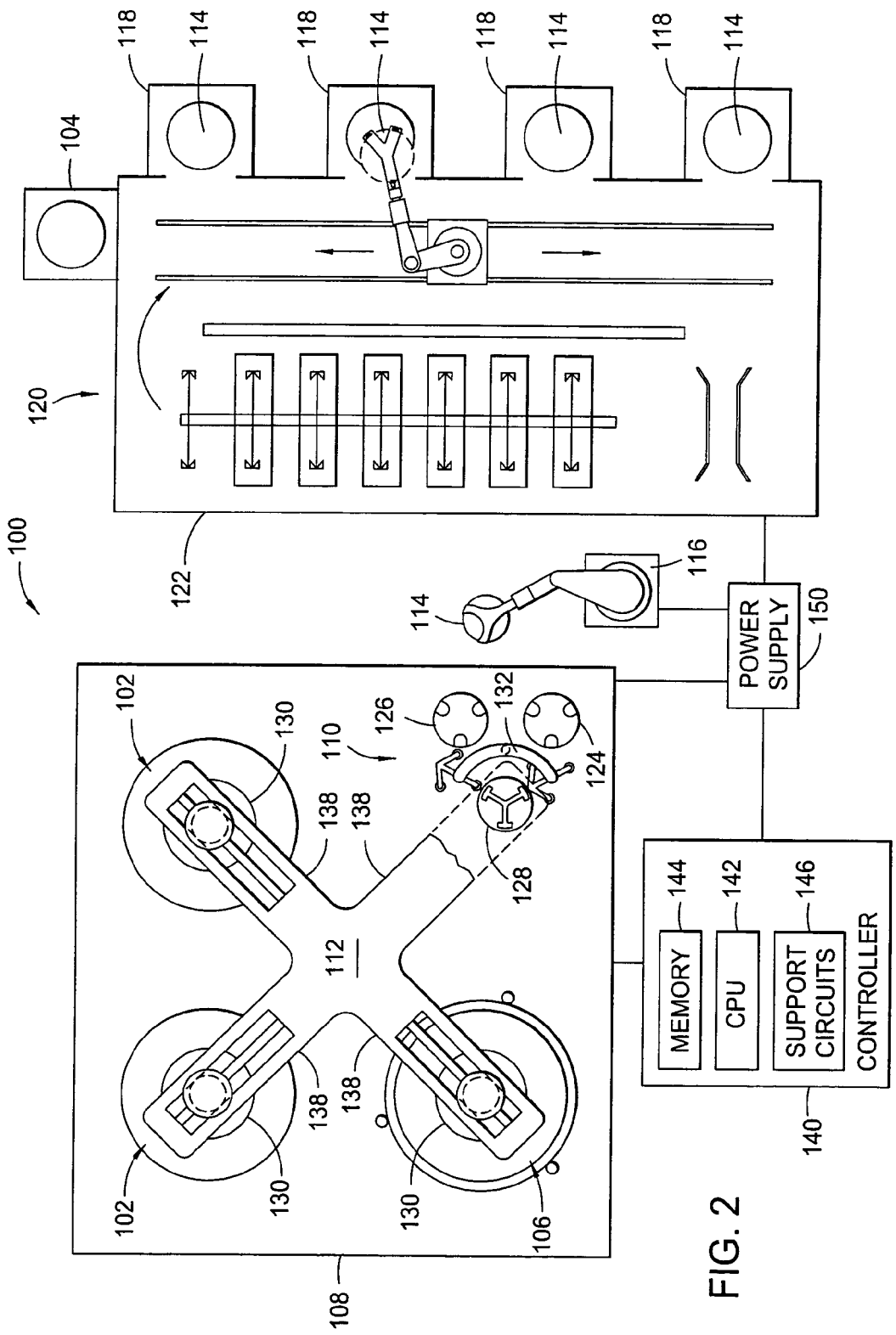
FIG. 2 is a plan view of one embodiment of a processing apparatus of the invention.

FIG. 2 depicts an electrochemical processing apparatus 100 having at least one electrochemical mechanical polishing (ECMP) station 102. Optionally, as depicted in the embodiment shown in FIG. 2, the system 100 may include at least one conventional polishing station 106 disposed adjacent the ECMP station 102 on a single platform or tool. One polishing tool that may be adapted to benefit from the invention is a REFLEXION® chemical mechanical polisher available from Applied Materials, Inc. located in Santa Clara, Calif. Examples of other polishing tools that may be adapted to benefit from the invention are MIRRA® and MIRRA MESA™ chemical mechanical polishers also available from Applied Materials, Inc.

The exemplary apparatus 100 generally includes a base 108 that supports the one or more ECMP stations 102, the one or more polishing stations 106, a transfer station 110 and a carousel 112. A loading robot 116 generally facilitates transfer of substrates 114 to and from the transfer station 110 of the apparatus 100 and a factory interface 120. The factory interface 120 may include a cleaning module 122, a metrology device 104 and one or more substrate storage cassettes 118. One example of a metrology device 104 that may be utilized in the factory interface 120 is a NovaScan™ Integrated Thickness Monitoring system, available from Nova Measuring Instruments, Inc., located in Phoenix, Ariz.

In one embodiment, the transfer station 110 includes an input buffer station 124, an output buffer station 126, a transfer robot 132, and a load cup assembly 128. The input buffer station 124 accepts substrates from the factory interface 120 by the loading robot 116. The loading robot 116 is also utilized to return polished substrates from the output buffer station 126 to the factory interface 120. The transfer robot 132 is utilized to move substrates between the buffer stations 124, 126 and the load cup assembly 128.

In one embodiment, the transfer robot 128 includes two gripper assemblies, each having pneumatic gripper fingers that hold the substrate 114 by the substrate's edge. The transfer robot 132 may simultaneously transfer a substrate to be processed from the input buffer station 124 to the load cup assembly 128 while transferring a processed substrate from the load cup assembly 128 to the output buffer station 126.

The carousel 112 has a plurality of arms 138, each respectively supporting one of a plurality of polishing heads 130. Each polishing head 130 retains one substrate 114 during processing. Substrates are loaded and unloaded from the polishing heads 130 by the load cup assembly 128. One of the arms 138 depicted in FIG. 2 is not shown so that the transfer station 110 may be seen. The carousel 112 moves the polishing heads 130 between the load cup assembly 128 of the transfer station 110, the one or more ECMP stations 102 and the one or more polishing stations 106. One carousel 112 that may be adapted to benefit from the invention is generally described in U.S. Pat. No. 5,804,507, issued Sep. 8, 1998 to Tolles et al., which is hereby incorporated by reference in its entirety. It is contemplated that other transfer mechanisms may be utilized to move substrates between the stations 102, 104 and the transfer station 110.

The polishing head 130 retains the substrate 114 against the ECMP station 102 or polishing station 106 during processing. Examples of embodiments of polishing heads 130 that may be adapted to benefit from the invention are described in U.S. Pat. No. 6,183,354, issued Feb. 6, 2001 to Zuniga, et al. Other polishing heads that may be adapted benefit from the invention include TITAN HEAD™ and TITAN PROFILER™ wafer carriers, available from Applied Materials, Inc. The arrangement of the ECMP stations 106 and polishing stations 102 on the apparatus 100 allows for the substrate 114 to be sequentially polished by moving the substrate between stations while being retained in the same polishing head 130. Alternatively, substrates may be polished in other sequences.

To facilitate control of the polishing apparatus 100 and processes performed thereon, a controller 140 comprising a central processing unit (CPU) 142, memory 144, and support circuits 146 is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memories such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Figure 3:
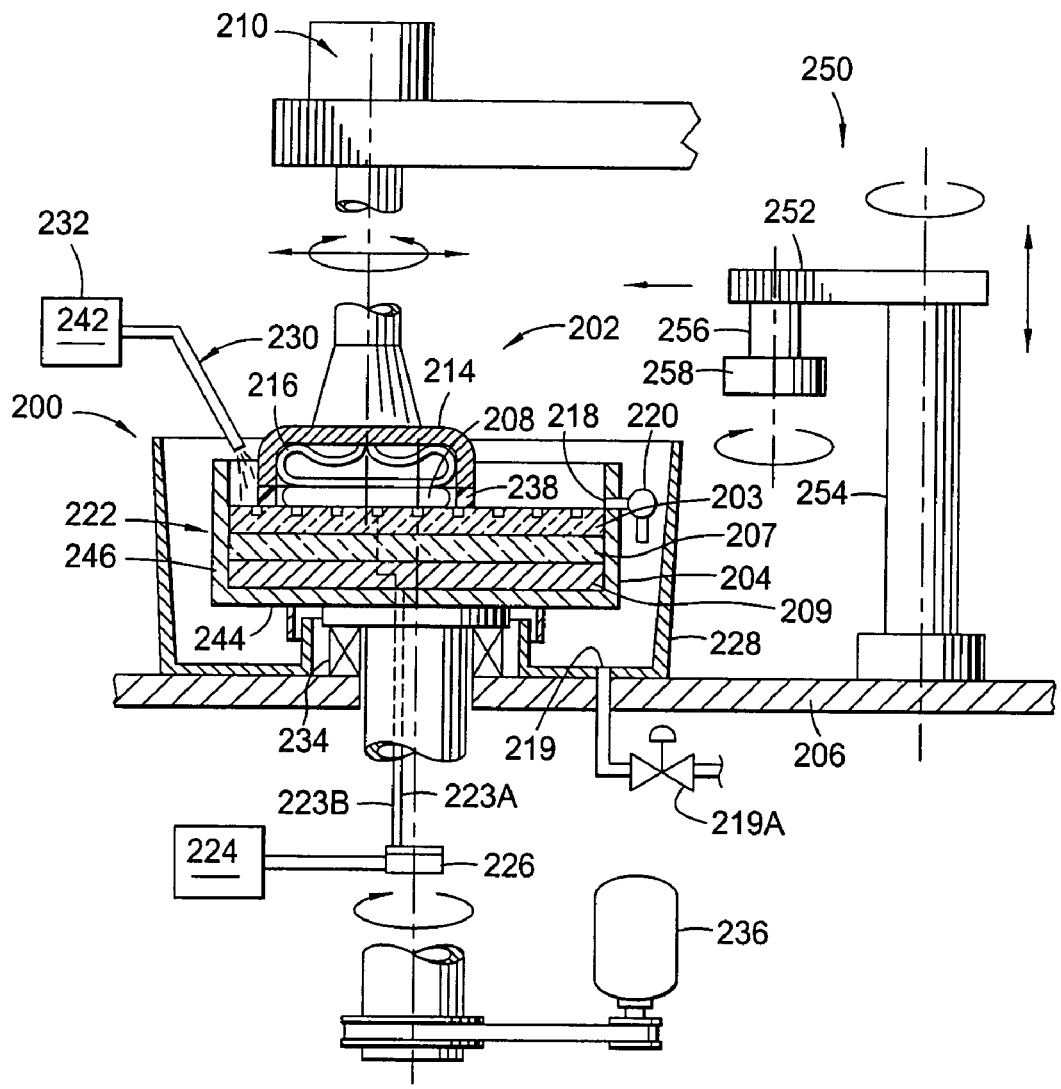
FIG. 3 is a cross-sectional view of one embodiment of a polishing process station.

FIG. 3 depicts one embodiment of the ECMP station 102 as a cross-sectional view of one embodiment of a "face-down" process cell 200. The process cell 200 generally includes a basin 204 and a polishing head 202. A substrate 208 is retained in the polishing head 202 and lowered into the basin 204 during processing in a face down (e.g., backside up) orientation. An electrolyte, such as described herein, flows into the basin 204 and is in contact with the substrate's surface and a polishing article assembly 222, while the polishing head 202 places the substrate 208 in contact with the polishing article assembly 222. The basin 204 includes the polishing article assembly 222, a bottom 244 and sidewalls 246 that define a container that houses the polishing article assembly 222. The sidewalls 246 include a port 218 formed therethrough to allow removal of polishing composition from the basin 204. The port 218 is coupled to a valve 220 to selectively drain or retain the polishing composition in the basin 204.

The substrate 208 and the polishing article assembly 222 disposed in the basin 204 are moved relative to each other to provide a polishing motion (or motion that enhances polishing uniformity). The polishing motion generally comprises at least one motion defined by an orbital, rotary, linear or curvilinear motion, or combinations thereof, among other motions. The polishing motion may be achieved by moving either or both of the polishing head 202 and/or the basin 204. The polishing head 202 may be stationary or driven to provide at least a portion of the relative motion between the basin 204 and the substrate 208 held by the polishing head 202. In the embodiment depicted in FIG. 3, the polishing head 202 is coupled to a drive system 210. The drive system 210 can generally move the polishing head 202 with at least a rotary, orbital, sweep motion, or combinations thereof.

The polishing head 202 generally retains the substrate 208 during processing. In one embodiment, the polishing head 202 includes a housing 214 enclosing a bladder 216. The bladder 216 may be deflated when contacting the substrate to create a vacuum therebetween, thus securing the substrate to the polishing head 202 to allow placement and removal of the substrate. The bladder 216 may additionally be inflated and pressurized to bias and assure contact between the substrate and the polishing article assembly 222 retained in the basin 204. A retaining ring 238 is coupled to the housing 214 and circumscribes the substrate 208 to prevent the substrate from slipping out from the polishing head 202 while processing. One polishing head that may be adapted to benefit from the invention is a TITAN HEAD™ carrier head available from Applied Materials, Inc., located in Santa Clara, Calif. Another example of a polishing head that may be adapted to benefit from the invention is described in U.S. Pat. No. 6,159,079, issued Dec. 12, 2001, which is hereby incorporated herein by reference in its entirety.

The basin 204 is generally fabricated from a plastic such as fluoropolymers, TEFLON® polymers, perfluoroalkoxy resin (PFA), polyethylene-based plastics (PE), sulfonated polyphenylether sulfones (PES), or other materials that are compatible or non-reactive with the polishing composition or other chemicals used in the processing cell 200. The basin 204 is rotationally supported above a base 206 by bearings 234. A drive system 236 is coupled to the basin 204 and rotates the basin 204 during processing. A catch basin 228 is disposed on the base 206 and circumscribes the basin 204 to collect processing fluids, such as a polishing composition, that flow out of port 218 disposed through the basin 204 during and/or after processing. An outlet drain 219 and outlet valve 219A are incorporated in the invention to allow the polishing composition in the catch basin to be sent to a reclaim system (not shown) or a waste drain (not shown).

In one embodiment the basin 204 is rotated at a velocity from about 3 to about 100 rpm, and the polishing head 202 is rotated at a velocity from about 5 to about 200 rpm and also moved linearly at a velocity of about 5 to about 25 centimeters per second in a direction radial to the basin 204. The preferred ranges for a 200 mm diameter substrate are a basin 204 rotational velocity of about 5 to about 40 rpm and a polishing head 202 rotational velocity of about 7 to about 100 rpm and a linear (e.g., radial) velocity of about 10 centimeters per second. The preferred ranges for a 300 mm diameter substrate are a basin 204 rotational velocity of about 5 to about 20 rpm and a polishing head 202 rotational velocity of about 7 to about 50 rpm and a linear (e.g., radial) velocity of about 10 centimeters per second. In one embodiment of the present invention the basin 204 has a diameter between about 17 inches and about 30 inches. The polishing head 202 may move along the radius of the basin 204 for a distance between about 0.1 inches and about 2 inches.

A polishing composition delivery system 232 is generally disposed adjacent the basin 204. The polishing composition delivery system 232 includes a nozzle or outlet 230 coupled to a polishing composition source 242. The outlet 230 delivers polishing composition or other processing fluids from the polishing composition source 242 into the basin 204. Alternatively, the polishing composition delivery system may provide polishing composition through an inlet (not shown) in the bottom 244 of the process cell, thus allowing polishing composition to flow through the polishing article assembly 222 to contact the conductive polishing article 203 and substrate 208. The polishing composition source 242 schematically shown here generally includes a source of all of the chemicals required to supply and support the polishing composition during processing. It is further contemplated in one embodiment of the current design to continually recirculate the polishing composition through the polishing article assembly 222 and across the surface of the substrate 208. In one embodiment the flow rate of polishing composition flowing through the process cell 200 is between about 0.1 to about 2 liters per minute.

Optionally, and shown in FIG. 3, a conditioning device 250 may be provided proximate the basin 204 to periodically condition or regenerate the polishing article assembly 222. Typically, the conditioning device 250 includes an arm 252 coupled to a stanchion 254 that is adapted to position and sweep a conditioning element 258 across polishing article assembly 222. The conditioning element 258 is coupled to the arm 252 by a shaft 256 to allow clearance between the arm 252 and sidewalls 246 of the basin 204 while the conditioning element 258 is in contact the polishing article assembly 222. The conditioning element 258 is typically a diamond or silicon carbide disk, which may be patterned to enhance working the surface of the polishing article assembly 222 into a predetermined surface condition/state that enhances process uniformity. Alternatively, the conditioning element 258 can be made of a Nylon™ brush or similar conditioner for in-situ conditioning the conductive polishing article 203. One conditioning element 258 that may be adapted to benefit from the invention is described in U.S. patent application Ser. No. 09/676,280, filed Sep. 28, 2000 by Li et al., which is incorporated herein by reference to the extent not inconsistent with the claims aspects and description herein.

A power source 224 is coupled to the polishing article assembly 222 by electrical leads 223A, 223B. The power source 224 applies an electrical bias to the polishing article assembly 222 to drive an electrochemical process described below. The leads 223A, 223B are routed through a slip ring 226 disposed below the basin 204. The slip ring 226 facilitates continuous electrical connection between the power source 224 and electrodes (209 and 203) in the polishing article assembly 222 as the basin 204 rotates. The leads 223A, 223B may be wires, tapes or other conductors compatible with process fluids or having a covering or coating that protects the leads from the process fluids. Examples of materials that may be utilized in the leads 223A, 223B include copper, graphite, titanium, platinum, gold, and HASTELOY® among other materials which can have an insulating coating on its exterior surface. Coatings disposed around the leads may include polymers such as fluorocarbons, PVC, polyamide, and the like. The slip ring 226 can be purchased from such manufacturers as IDM Electronics LTD, Reading Berkshire, England, a division of Kaydon Corporation, Ann Arbor, Mich.

The polishing article assembly 222 generally includes a conductive polishing article 203 coupled to a backing 207, and an electrode 209. The backing 207 may also be coupled to an electrode 209. The conductive polishing article 203 and the backing 207 have a plurality of holes or pores formed therein to allow the polish composition to make contact with, and thus provide a conductive path between the substrate 208 and the electrode 209. A dielectric insert (not shown) may be disposed between the conductive polishing article 203 and the backing 207 or between the backing 207 and the electrode 209 to regulate the electrolyte flow through all or a portion of the conductive polishing article 203, by use of a plurality of holes or pores formed therein. The conductive polishing article 203 is used to apply a uniform bias to the substrate surface by use of a conductive surface that makes contact with the surface of the substrate. The use of a conductive polishing article is generally preferred over the use of a conventional substrate contacting means such as discrete or point contacts, but should not be considered limiting to the scope of the present invention. During the anodic dissolution process the electrode 209 is generally biased as a cathode and the conductive polishing article 203, and substrate, are biased as an anode through use of the power supply 224.

Examples of the conductive polishing article 203 are more fully disclosed in U.S. patent application Ser. No. 10/033,732, filed on Dec. 27, 2001, and U.S. patent application Ser. No. 10/211,626, filed on Aug. 2, 2002, which are incorporated by reference herein to the extent not inconsistent with the claimed aspects and disclosure herein. Examples of an embodiment of the conductive polishing article 203 utilizing conventional polishing material (non-conductive) with discrete conductive contacts are more fully disclosed in the U.S. patent application Ser. No. 10/211,626, filed on Aug. 2, 2003, which is incorporated by reference herein to the extent not inconsistent with the claimed aspects and disclosure herein.

As the polishing article assembly 222 includes elements comprising both an anode and cathode of an electrochemical cell, both the anode and a cathode may be replaced simultaneously by simply removing a used polishing article assembly 222 from the basin 204 and inserting a new polishing article assembly 222 with fresh electrical and supporting components into the basin 204. The face-down polishing apparatus is more fully disclosed in U.S. patent application Ser. No. 10/151,538, filed May 16, 2002 (now abandoned) entitled "Method and Apparatus for Substrate Polishing," commonly assigned to Applied Materials Inc., of which paragraphs 25–81 are incorporated herein by reference to the extent not inconsistent with the claims aspects and description herein.

Typically, the conductive polishing article 203, the backing 207, optionally, the dielectric insert, and the electrode 209 are secured together to form a unitary body that facilitates removal and replacement of the polishing article assembly 222 from the basin 204. The conductive polishing article 203, the backing 207, optionally the dielectric insert, and/or the electrode 209 may be coupled by use of methods such as adhesive bonding, thermal bonding, sewing, binding, heat staking, riveting, by use of fasteners and clamping, among others.

The process cell 200 may be disposed on a polishing platform with one or more chemical mechanical polishing platens suitable for conductive material and/or barrier material removal. Such chemical mechanical polishing platens may contain fixed-abrasive or non-abrasive polishing articles and may use abrasive containing or abrasive-free polishing composition. Additionally the polishing articles for the polishing platens may be hard polishing articles, having a durometer or hardness of 50 or greater on a shore D Scale or soft polishing articles having a durometer or hardness of less than 50, typically 40 or less, on a shore D Scale.

For example, the polishing platform may be of a three platen variety, such as the MIRRA® polishing system, the MIRRA MESA™ polishing system, and the REFLEXION® polishing system, that are commercially available from Applied Materials, Inc., of Santa Clara, Calif., with the process cell 200 disposed at a first platen position, a conventional chemical mechanical polishing platen with a hard or soft polishing pad on a second platen position, and a barrier removal platen on the third platen position. In another example, a first process cell 200 disposed at a first platen position, for example, ECMP station 102, for a first electrochemical mechanical polishing process, a second process cell 200 disposed at a second platen position, for example, ECMP station 102, for a second electrochemical mechanical polishing process, and a conventional chemical mechanical polishing platen with a hard or soft polishing pad on a third platen position. However, any system enabling electrochemical mechanical polishing with or without the presence of chemical mechanical polishing ability may be used to advantage.

Polishing Processes

Methods are provided for polishing a substrate to remove polishing residues and minimize dishing within features. The methods may be performed by an electrochemical polishing technique. In one aspect, the method may include processing a substrate having a conductive material layer disposed over narrow feature definitions and wide feature definitions, supplying a polishing composition to the surface of the substrate, applying a pressure between the substrate and a polishing article, providing relative motion between the substrate and the polishing article, applying a bias between a first electrode and a second electrode in electrical contact with the substrate, and removing conductive material disposed over narrow feature definitions and substrate field areas at a higher removal rate than conductive material disposed over wide feature definitions.

One embodiment of the process will now be described in reference to FIGS. 4A–4E, which are schematic cross-sections views of substrate being formed according to processes described herein.

Figure 4A:
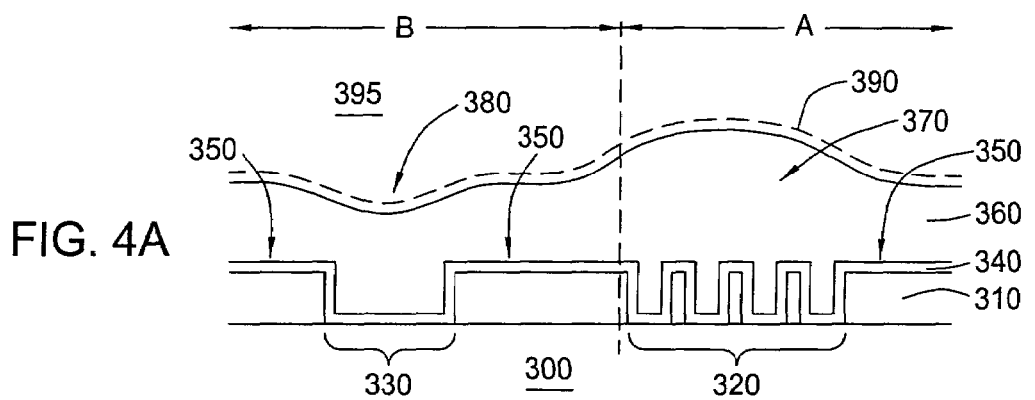
FIGS. 4A–4E are schematic cross-sectional views illustrating a polishing process performed on a substrate according to one embodiment for planarizing a substrate surface described herein.

Referring to FIG. 4A, a substrate generally includes a dielectric layer 310 formed on a substrate 300. A plurality of apertures, such as vias, trenches, contacts, or holes, are patterned and etched into the dielectric layer 310 in area A to form a dense array of narrow feature definitions 320 with area B being having a low density of wide feature definitions 330. The apertures may be formed in the dielectric layer 310 by conventional photolithographic and etching techniques.

The terms narrow and wide feature definitions may vary depending on the structures formed on the substrate surface, but can generally be characterized by the respective deposition profiles of excessive material deposition (or high overburden) formed over narrow feature definitions and minimal or low material deposition (minimal or low overburden), over wide feature definitions. For example narrow feature definitions may be about 0.13 µm in size and may have a high overburden as compared to wide feature definitions that may be about 10 µm in size and that may have minimal or insufficient overburden.

The dielectric layer 310 may comprise one or more dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluoro-silicon glass (FSG), polymers, such as polyamides, carbon-containing silicon oxides, such as Black Diamond™ dielectric material, silicon carbide materials, which may be doped with nitrogen and/or oxygen, including BLOk™ dielectric materials, available from Applied Materials, Inc. of Santa Clara, Calif.

A barrier layer 340 is disposed conformally in the feature definitions 320 and 330 and on the field 350 of the substrate 300. The barrier layer 340 may comprise tantalum, tantalum nitride, or combinations thereof. As used throughout this disclosure, the word "tantalum" and the symbol "Ta" are intended to encompass tantalum, tantalum nitride, and alloys, such as tantalum silicon nitride, or combinations thereof. Other types of barrier layers materials may include titanium, titanium nitride, refractory metals, refractory metal nitrides, and combinations thereof, or any other material that may limit diffusion of materials between the substrate and/or dielectric materials and any subsequently deposited conductive materials.

A conductive material layer 360 is disposed on the barrier layer 340 at a thickness (D). The term "conductive material layer" as used herein is defined as any conductive material, such as copper, tungsten, or aluminum, used to fill a feature to form lines, contacts, or vias. While not shown, a seed layer of a conductive material may be deposited on the barrier layer prior to the deposition of the conductive material layer 360 to improve interlayer adhesion and improve subsequent deposition processes. The seed layer may be of the same material as the subsequent material to be deposited.

One type of conductive material layer 360 comprises copper containing materials. Copper containing materials include copper, copper alloys (e.g., copper-based alloys containing at least about 80 weight percent copper), or doped copper. As used throughout this disclosure, the phrase "copper containing material," the word "copper," and the symbol "Cu" are intended to encompass copper, copper alloys, doped copper, and combinations thereof. Additionally, the conductive material may comprise any conductive material used in semiconductor manufacturing processing.

The deposited conductive material layer 360 has a deposition profile of excessive material deposition or high overburden 370 formed over narrow feature definitions 320, and minimal overburden 380 over wide feature definitions 330.

The substrate may then be positioned in a polishing apparatus, such as the apparatus descried herein and shown in FIG. 3, and exposed to a polishing composition that can form a passivation layer 390 on the conductive material layer.

Polishing Compositions

Suitable polishing compositions that may be used with the processes described herein to planarize metals, such as copper, may comprise an acid based electrolyte system, one or more chelating agents, one or more corrosion inhibitors, one or more inorganic or organic acid salts, one or more pH adjusting agents, to produce a pH between about 2 and about 10, for example between about 4 and about 7, and a solvent.

Although the polishing compositions are particularly useful for removing copper, it is believed that the polishing compositions also may be used for the removal of other conductive materials, such as aluminum, platinum, tungsten, titanium, titanium nitride, tantalum, tantalum nitride, cobalt, gold, silver, ruthenium and combinations thereof. Mechanical abrasion, such as from contact with the conductive polishing article 203 may be used with the polishing composition to improve planarity and improve removal rate of these conductive materials.

The polishing composition includes an acid based electrolyte system for providing electrical conductivity. Suitable acid based electrolyte systems include, for example, sulfuric acid based electrolytes, nitric acid based electrolytes, phosphoric acid based electrolytes, perchloric acid based electrolytes, acetic acid based electrolytes, and combinations thereof. Suitable acid based electrolyte systems include an acid electrolyte, such as phosphoric acid and/or sulfuric acid, as well as acid electrolyte derivatives, including ammonium and potassium salts thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, copper phosphate, potassium phosphates ($K_xH_{(3-x)}PO_4$) (x=1, 2, 3), ammonium dihydrogen phosphate (($NH_4$)$H_2PO_4$), diammonium hydrogen phosphate (($NH_4$)$_2$ $HPO_4$), compounds having a nitrite group ($NO_3^{1-}$), such as, nitric acid or copper nitrate, and compounds having a sulfate group ($SO_4^{2-}$), such as sulfuric acid ($H_2SO_4$), ammonium hydrogen sulfate ($NH_4HSO_4$), ammonium sulfate, potassium sulfate, copper sulfate, or combinations thereof. The invention also contemplates that conventional electrolytes known and unknown may also be used in forming the composition described herein using the processes described herein.

The acid based electrolyte system may contain an acidic component that can take up about 1 to about 30 percent by weight (wt. %) or volume (vol %) of the total composition of solution to provide suitable conductivity for practicing the processes described herein. Examples of acidic components are, dihydrogen phosphate and/or diammonium hydrogen phosphate may be present in the polishing composition in amounts between about 15 and about 25 percent by weight. Alternately, phosphoric acid may be present in concentrations up to 30 wt. %, for example, between about 2 wt. % and about 6 wt. %.

One aspect or component of the present invention is the use of one or more chelating agents to complex with the surface of the substrate to enhance the electrochemical dissolution process. In any of the embodiments described herein, the chelating agents can bind to a conductive material, such as copper ions, increase the removal rate of metal materials and/or improve dissolution uniformity across the substrate surface. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The chelating agents may also be used to buffer the polishing composition to maintain a desired pH level for processing a substrate. The chelating agents may also form or enhance the formation of a passivation layer on the substrate surface.

The one or more chelating agents can include compounds having one or more functional groups selected from the group of amine groups, amide groups, carboxylate groups, dicarboxylate groups, tri-carboxylate groups, hydroxyl groups, a mixture of hydroxyl and carboxylate groups, and combinations thereof. The one or more chelating agents may also include salts of the chelating agents described herein. The polishing composition may include one or more chelating agents at a concentration between about 0.1% and about 15% by volume or weight, but preferably utilized between about 0.1% and about 4% by volume or weight. For example, about 2% by volume of ethylenediamine may be used as a chelating agent.

Examples of suitable chelating agents having one or more carboxylate groups include citric acid, tartaric acid, succinic acid, oxalic acid, and combinations thereof. Other suitable acids having one or more carboxylate groups include acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof. Further examples of suitable chelating agents include compounds having one or more amine and amide functional groups, such as ethylenediamine, diethylenetriamine, diethylenetriamine derivatives, hexadiamine, amino acids, ethylenediaminetetraacetic acid, methylformamide, or combinations thereof.

In any of the embodiments described herein, the inorganic or organic acid salts may be used to perform as a chelating agent. The polishing composition may include one or more inorganic or organic salts at a concentration between about 0.1% and about 15% by volume or weight of the composition, for example, between about 0.1% and about 8% by volume or weight. For example, about 2% by weight of ammonium citrate may be used in the polishing composition.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used.

In any of the embodiments described herein, the corrosion inhibitors can be added to reduce the oxidation or corrosion of metal surfaces by forming a passivation layer that minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution. The polishing composition may include between about 0.001% and about 5.0% by weight of the organic compound from one or more azole groups. The commonly preferred range being between about 0.2% and about 0.4% by weight.

Examples of organic compounds having azole groups include benzotriazole, mercaptobenzotriazole, 5-methyl-1-benzotriazole, and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor includes urea and thiourea among others.

Alternatively, polymeric inhibitors, for non-limiting examples, polyalkylaryl ether phosphate or ammonium nonylphenol ethoxylate sulfate, may be used in replacement or conjunction with azole containing corrosion inhibitors in an amount between about 0.002% and about 1.0% by volume or weight of the composition.

One or more pH adjusting agents is preferably added to the polishing composition to achieve a pH between about 2 and about 10, and preferably between a pH of about 4 and about 7. The amount of pH adjusting agent can vary as the concentration of the other components is varied in different formulations, but in general the total solution may include up to about 70 wt. % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, or combinations thereof, providing the desired pH level.

The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids, such as strong acids including sulfuric acid, nitric acid, and combinations thereof, may also be used in the polishing composition.

The balance or remainder of the polishing compositions described herein is a solvent, such as a polar solvent, including water, preferably deionized water, and organic solvents, for example, alcohols, such as isopropyl alcohol, or glycols.

The polishing composition may include one or more additive compounds. Additive compounds include electrolyte additives including, but not limited to, suppressors, enhancers, levelers, brighteners, stabilizers, and stripping agents to improve the effectiveness of the polishing composition in polishing of the substrate surface. For example, certain additives may decrease the ionization rate of the metal atoms, thereby inhibiting the dissolution process, whereas other additives may provide a finished, shiny substrate surface. The additives may be present in the polishing composition in concentrations up to about 15% by weight or volume, and may vary based upon the desired result after polishing.

Surfactants may be one such additive compound in the polishing composition. One or more surfactants may be used in the polishing composition to increase the dissolution or solubility of materials, such as metals and metal ions or by-products produced during processing, improve chemical stability, and reduce decomposition of components of the polishing composition. The one or more surfactants can comprise a concentration between about 0.001% and about 10% by volume or weight of the polishing composition. A concentration between about 0.01% and about 2% by volume or weight, for example between about 0.1% and about 1% by volume or weight, of the surfactants may be used in one embodiment of the polishing composition. The one or more surfactants may include non-ionic surfactants as well as ionic surfactants including anionic surfactants, cationic surfactants, amphoteric surfactants, and ionic surfactants having more than one ionic functional group, such as Zweitter-ionic surfactants. Dispersers or dispersing agents are considered to be surfactants as surfactants are used herein.

Other examples of additives include one or more leveling agents, which are broadly defined herein as additives that suppress dissolution current on the surface of a substrate. Leveling agents suppress dissolution current by attaching to conductive materials, by inhibiting the electrochemical reactions between the electrolyte and conductive material, and/or form depolarizing agents that limit electrochemical reactions. A concentration of leveling agents between about 0.005% and about 10% by volume or weight, for example, between about 0.05% and about 2% by volume or weight of the electrolyte solution can be used.

Leveling agents include, but are not limited to, polyethylene glycol and polyethylene glycol derivatives. Other leveling agents which can be employed in the process described herein include any employed in the electroplating or electropolishing art, such as polyamines, polyamides and polyimides including polyethyleneimine, polyglycine, 2-amino-1-naphthalenesulfonic acid, 3-amino-1-propanesulfonic acid, 4-aminotoluene-2-sulfonic acid.

Suppressors, such as electrically resistive additives that reduce the conductivity of the polishing composition may be added to the composition in an amount between about 0.005% and about 2% by volume or weight of the composition. Suppressors include polyacrylamide, polyacrylic acid polymers, polycarboxylate copolymers, coconut diethanolamide, oleic diethanolamide, ethanolamide derivatives, or combinations thereof.

One or more stabilizers may be present in an amount that is sufficient to produce measurable improvements in composition stability. The one or more stabilizers may be present in an amount ranging from about 100 ppm to about 5.0 weight percent (wt. %). Non-limiting examples of preferred stabilizers include but are not limited to phosphoric acids and phosphoric acid derivatives including aminotri(methylenephosphonic) acid, 1-hydroxyethylidene-4-diphosphonic acid, hexamethylenediaminetetramethylene phosphoric acid, and diethylenetetramine pentamethylenephosphonic acid, and derivative salts thereof.

Accelerators are another example of an additive that may be included in the polishing composition. Accelerators increase electrochemical reactions of metals disposed on the substrate surface to increase metal removal. The composition may include one or more accelerators at a concentration between about 0.001% and about 1% by volume or weight, for example, between about 0.25 and about 0.8% by volume or weight. Accelerators may include sulfur-containing compounds, such as sulfite or di-sulfate.

Further examples of additives to the polishing composition are more fully described in U.S. patent application Ser. No. 10/141,459, filed on May 7, 2002, which is incorporated by reference herein to the extent not inconsistent with the claimed aspects and disclosure herein.

Electrochemical Mechanical Processing:

An electrochemical mechanical polishing technique using a combination of chemical activity, mechanical activity, and electrical activity to remove material and planarize a substrate surface may be performed as follows. In one embodiment of an electrochemical mechanical polishing technique, the substrate is disposed in a receptacle, such as a basin or platen containing a first electrode and a polishing composition. The polishing composition forms a passivation layer on the substrate surface. The passivation layer may chemically and/or electrically insulate material disposed on a substrate surface.

A polishing article coupled to a polishing article assembly containing a second electrode is then disposed in the basin or platen and physically contacted and/or electrically coupled with the substrate through the polishing article. Relative motion is provided between the substrate surface and the conductive article 203 to reduce or remove the passivation layer. A bias from a power source 224 is applied between the two electrodes. The bias may be applied by an electrical pulse modulation technique providing at least anodic dissolution. The bias may be transferred from a conductive article 203 in the polishing article assembly 222 to the substrate 208.

Figure 4B:
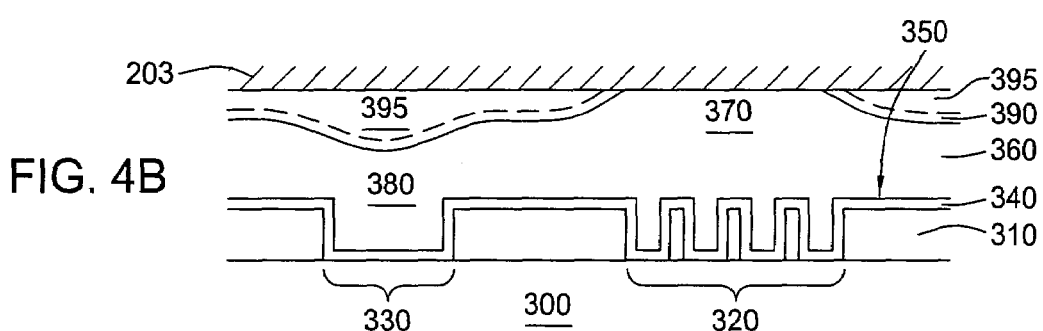
Figure 4C:
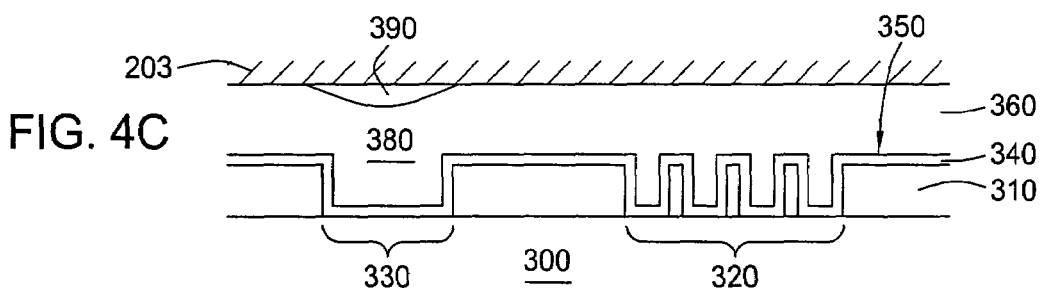
Figure 4D:
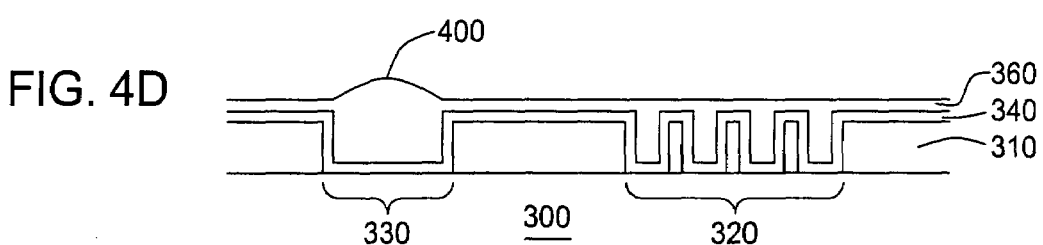
Figure 4E:
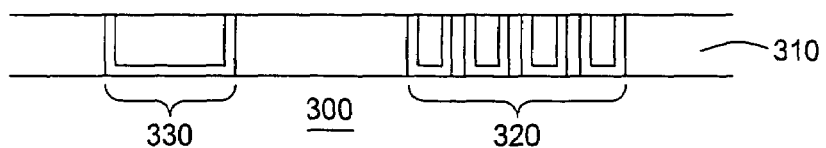

The electrochemical polishing process may be used to remove bulk conductive material from the substrate surface as shown in FIGS. 4A–4C and then chemical mechanical polishing or a second electrochemical polishing process to remove residual copper containing materials as shown in FIGS. 4D–4E. Bulk material is broadly defined herein as any material deposited on the substrate in an amount more than sufficient to substantially fill features formed on the substrate surface. Residual material is broadly defined as any bulk copper containing material remaining after one or more polishing process steps.

The bulk removal electrochemical mechanical polishing process may be performed on a first polishing platen and the residual removing process on a second polishing platen of the same or different polishing apparatus as the first platen. Any barrier material used to prevent conductive material diffusion through layer of a substrate may be removed on a separate platen, such as the third platen in the apparatus described herein. For example, the apparatus described above in accordance with the processes described herein may include three platens for removing bulk material or comprise one platen to remove bulk material, a second platen for residual removal, and a third platen for barrier removal.

Referring to FIG. 4A, the substrate 300 having a dielectric layer 310 patterned with narrow feature definitions 320 and wide feature definitions 330 is field with a barrier layer 340, for example, tantalum, and an excess amount of conductive material 360, for example, copper. The deposition profile of the excess material includes a high overburden 370, also referred to as a hill or peak, formed over narrow feature definitions 320 and a minimal overburden 380, also referred to as a valley, over wide feature definitions 330.

The substrate is exposed to a polishing composition 395 described herein that forms a passivation layer 390 on the conductive material layer 360. The passivation layer 390 forms on the exposed conductive material 360 on the substrate surface including the high overburden 370, peaks, and minimal overburden 380, valleys, formed in the deposited conductive material 360. The passivation layer 390 chemically and/or electrically insulates the surface of the substrate from chemical and/or electrical reactions. The passivation layer is formed from the exposure of the substrate surface to the corrosion inhibitor and/or other materials capable of forming a passivating or insulating film, for example, chelating agents. The thickness and density of the passivation layer can dictate the extent of chemical reactions and/or amount of anodic dissolution. For example, a thicker or denser passivation layer 390 has been observed to result in less anodic dissolution compared to thinner and less dense passivation layers. Thus, control of the composition of passivating agents, corrosion inhibitors and/or chelating agents, allow control of the removal rate and amount of material removed from the substrate surface.

The substrate surface and a polishing article, such as conductive polishing article 203, are contacted with one another and moved in relative motion to one another, such as in a relative orbital motion, to remove portions of the passivation layer 390 formed on the exposed conductive material 360 as shown in FIG. 4B, which may also remove a portion of the underlying conductive material 360.

The substrate surface and polishing article are contacted at a pressure less than about 2 psi. Removal of the passivation layer 390 and some conductive material 360 may be performed with a process having a pressure of about 1 psi or less, for example, between about 0.01 psi and about 0.5 psi. In one aspect of the process, a pressure of about 0.2 psi or less is used.

The polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as dishing and scratches, and delamination, during polishing. Contact between the substrate and a conductive polishing article also allows for electrical contact between the power source and the substrate by coupling the power source to the polishing article when contacting the substrate.

A region of non-passivated material may be exposed and removed by anodic dissolution by mechanical abrasion to disturb or remove the passivation layer on the surface of the substrate.

A bias is applied to the substrate during contact between the substrate surface and the conductive polishing article 203 for anodic dissolution of the conductive material 360 from the substrate surface. The bias is generally provided to produce anodic dissolution of the conductive material from the surface of the substrate at a current density up to about 100 milliamps/cm$^2$, about 40 amps, to include processing of substrates up to about 300 mm in size, for example, between about 0.01 milliamps/cm$^2$, about 0.01 amps, and about 50 milliamps/cm$^2$, about 20 amps, for a 200 mm substrate. The invention also contemplates that the bias may be applied and monitored by volts, amps, and watts. For example, in one embodiment, the power supply may apply a power between about 0 Watts and 100 Watts, a voltage between about 0 V and about 10 V, and a current between about 0 amps and about 10 amps.

During anodic dissolution under application of the bias, the substrate surface, i.e., the conductive material layer 360 may be biased anodically above a threshold potential of the conductive material, for example, a metal material, on the substrate surface to "oxidize". When a metal material oxidizes, a metal atom gives up one or more electrons to the power source 224 and forms metal ions or cations. The metal ions may then leave the substrate surface and dissolve into the electrolyte solution. In the case where copper is the desired material to be removed, cations can have the $Cu^{1+}$ or $Cu^{2+}$ oxidation state.

The metal ions may also contribute to the formation of the thickness and/or density of the passivation layer 390. For example, the inhibitors and/or chelating agents found in the polishing composition may complex with the metal ions and the metal ions become incorporated into the passivation layer 390. Thus, the presence of the inhibitors and/or chelating agents found in the polishing composition limit or reduce the electrochemical dissolution process of the metal ions into the electrolyte, and further incorporate such metal ions into the passivation layer 390. It has been observed that the thickness and/or density of the undisturbed passivation layer may increase after periods of applied bias for anodic dissolution of conductive materials on the substrate surface. It is believed that the increase in the thickness and/or density of the undisturbed passivation layer is related to the total applied power and is a function of time and/or power levels. It has also been observed that the undisturbed passivation layer incorporates metal ions and that the metal ions may contribute to the thickness and/or density of the passivation layer.

The bias may be varied in power and application depending upon the user requirements in removing material from the substrate surface. For example, increasing power application has been observed to result in increasing anodic dissolution. The bias may also be applied by an electrical pulse modulation technique. Pulse modulation techniques may vary, but generally include a cycle of applying a constant current density or voltage for a first time period, then applying no current density or voltage or a constant reverse current density or voltage for a second time period. The process may then be repeated for one or more cycles, which may have varying power levels and durations. The power levels, the duration of power, an "on" cycle, and no power, an "off" cycle" application, and frequency of cycles, may be modified based on the removal rate, materials to be removed, and the extent of the polishing process. For example, increased power levels and increased duration of power being applied have been observed to increase anodic dissolution.

In one pulse modulation process for electrochemical mechanical polishing, the pulse modulation process comprises an on/off power technique with a period of power application, "on", followed by a period of no power application, "off". The on/off cycle may be repeated one or more times during the polishing process. The "on" periods allow for removal of exposed conductive material from the substrate surface and the "off" periods allow for polishing composition components and by-products of "on" periods, such as metal ions, to diffuse to the surface and complex with the conductive material. During a pulse modulation technique process it is believed that the metal ions migrate and interact with the corrosion inhibitors and/or chelating agents by attaching to the passivation layer in the non-mechanically disturbed areas. The process thus allows etching in the electrochemically active regions, not covered by the passivation layer, during an "on" application, and then allowing reformation of the passivation layer in some regions and removal of excess material during an "off" portion of the pulse modulation technique in other regions. Thus, control of the pulse modulation technique can control the removal rate and amount of material removed from the substrate surface.

The "on"/"off" period of time may be between about 1 seconds and about 60 seconds each, for example, between about 2 and about 25 seconds, and the invention contemplates the use of pulse techniques having "on" and "off" periods of time greater and shorter than the described time periods herein. In one example of a pulse modulation technique, power is applied between about 16% and about 66% of each cycle.

Non-limiting examples of pulse modulation technique with an on/off cycle for electrochemical mechanical polishing of materials described herein include: applying power, "on", between about 5 and about 10 seconds and then not applying power, "off", between about 2 and about 25 seconds; applying power for about 10 seconds and not applying power for 5 seconds, or applying power for 10 seconds and not applying power for 2 seconds, or even applying power for 5 seconds and not applying power for 25 seconds to provide the desired polishing results. The cycles may be repeated as often as desired for each selected process. One example of a pulse modulation process is described in U.S. Pat. No. 6,379,223, entitled "Method And Apparatus For Electrochemical Mechanical Planarization", issued on Apr. 22, 2002, which is incorporated by reference herein to the extent not inconsistent with the claimed aspects and disclosure herein. Further examples of a pulse modulation process is described in co-pending U.S. Provisional Patent Application Serial No. 60/395,768, entitled "Effective Method To Improve Surface Finish In Electrochemically Assisted Chemical Mechanical Polishing", filed on Jul. 11, 2002, which is incorporated by reference herein to the extent not inconsistent with the claimed aspects and disclosure herein.

A removal rate of conductive material of up to about 15,000 Å/min can be achieved by the processes described herein. Higher removal rates are generally desirable, but due to the goal of maximizing process uniformity and other process variables (e.g., reaction kinetics at the anode and cathode) it is common for dissolution rates to be controlled between about 100 Å/min and about 15,000 Å/min. In one embodiment of the invention where the copper material to be removed is less than 5,000 Å thick, the voltage (or current) may be applied to provide a removal rate between about 100 Å/min and about 5,000 Å/min. The substrate is typically exposed to the polishing composition and power application for a period of time sufficient to remove at least a portion or all of the desired material disposed thereon.

Referring to FIG. 4C, mechanical abrasion by the conductive polishing article 203 removes the passivation layer that insulates or suppresses the current for anodic dissolution, such that areas of high overburden 370 and the substrate field 350 are preferentially removed over areas of minimal overburden 380 as the passivation layer is retained in areas of minimal or no contact with the conductive polishing article 203. The removal rate of the conductive material 360 covered by the passivation layer is less than the removal rate of conductive material without the passivation layer. As such, the excess material disposed over narrow feature definitions 320 and the substrate field 350 is removed at a higher rate than over wide feature definitions 330 still covered by the passivation layer 390.

Referring to FIG. 4D, the process described herein may allow for the formation of a protrusion 400 in the conductive material layer 360 formed over the wide features. The protrusion 400 is formed from material that was unpolished or polished at a reduced removal rate due to the formation of a thicker or more dense passivation layer or for longer durations than other portions of the conductive material layer 360. For example, the protrusion may be up to about 50% of the deposited conductive material thickness, such as between about 1% and about 40% of the deposited conductive material thickness. The processes described herein have been observed herein to produce a protrusion between about 20% and about 30% of the deposited material thickness.

The amount or size of the protrusion 400 may be controlled, for example, by varying the chemistry used in the process, the power application, such as power levels, and pulse modulation technique. The invention contemplates that the compositions described herein and the power applications described herein may be varied beyond the illustrative examples detailed herein to achieve the formation of a protrusion herein and/or the relative removal rates over wide and narrow feature definitions.

The size of the protrusions may be controlled by the amount of corrosion inhibitor and/or chelating agents, the pH levels, the power application levels, and process parameters of a pulse modulation technique, or a combination thereof, as described herein. For example, increase amounts of corrosion inhibitor were observed to increase the amount protrusion over wide features as compared to reduced amounts of corrosion inhibitors.

In one comparison example under identical polishing conditions for a polishing layer of about 11,500 Å thick with a step height of about 6,000 Å, a polishing process with a composition of 0.3 wt. % benzotriazole (BTA) as a corrosion inhibitor exhibited a protrusion height of about 4,200 Å, about a 36.5% protrusion of the deposited conductive material, and a polishing process with a composition of 0.2 wt. % BTA as a corrosion inhibitor exhibited a protrusion height of about 800 Å, about a 7% protrusion of the deposited conductive material. In another comparison example, under identical polishing conditions but different from the first comparison example, a polishing process with a composition of 0.3 wt. % BTA as a corrosion inhibitor exhibited a protrusion of about 2,500 Å, about a 22% protrusion of the deposited conductive material, and a polishing process with a composition of 0.2 wt. % BTA as a corrosion inhibitor exhibited a protrusion of about 0 Å, or no observable protrusion.

The pH of the composition has also been observed to affect the amount of protrusion. Compositions having less acidic composition were also observed to have greater protrusion height over composition with more acidic compositions. In a comparison example under identical polishing conditions, a polishing process with a pH of 6.5 exhibited a protrusion height of about 3,000 Å, about a 26% protrusion of the deposited conductive material, a polishing process with a pH of about 5.8 exhibited a protrusion height of about 200 Å, about a 1.7% protrusion of the deposited conductive material, and a polishing process with a pH of about 4.5 exhibited a protrusion height of about 0 Å, or no observable protrusion height. Further, a balance of pH and corrosion inhibitor concentration may be used to provide for a selective amount of protrusion. For example a lower pH at a lower corrosion inhibitor concentration may produce the same amount of protrusion as a higher pH with a greater corrosion inhibitor concentration.

Power application may also be adapted to control the amount of protrusion in the process. For example, with same or similar processing compositions, a power application with a greater amount of power application in the "on" portion of the pulse modulation technique exhibited greater protrusion height formation than a power application with a lesser amount of applied power in the "on" portion of the pulse modulation technique. Power applied during the process may be referenced as voltage, current, current density, wattage, or other suitable means for monitoring and controlling the anodic dissolution process. A greater amount of power application may be achieved, for example, by an increase in the power level, i.e., increase voltage, current, current density, or wattage, an increase in the duration of a power period or pulse, or a combination thereof. Power and pulse modulation techniques may be varied based on changes in the processing parameters, for example, different electrolyte composition, may have different conductivities, and may require different power levels and pulse modulations.

It is believed that when power is applied, the "on" position, the formation of the passivation layer may increase in thickness and/or density because of metal ions complexing with components of the passivation layer, and in the "off" position, the passivation layer is subject to more abrasion and removal, due to ion starvation in the electrolyte near the surface of the conductive material being removed. An increase in thickness or density of the passivation layer is believed to result in better chemical and/or electrical insulative properties as well as increased resistance to removal by abrasion.

Thus, an increase in the total power applied to the substrate, such as an increase in the duration or magnitude of the applied power has been observed to result in increased protrusion height. In one comparison example using a composition having 0.3 wt % BTA and a pH of about 6.5 under similar processing conditions, a protrusion height of about 4,000 Å for a metal layer of about 11,500 Å or less, about a 35% protrusion of the deposited conductive material, was observed to be formed under an "on" only power application, while a pulse modulation technique of 5 seconds "on" and 5 seconds "off" has been observed to result in a protrusion height of less than 400 Å.

Referring to FIG. 4E, any remaining conductive material and barrier layer material may then be polished by a second polishing step to provide a planarized substrate surface. The remaining conductive material and barrier layer material may be removed by at least a chemical mechanical polishing process. Since chemical mechanical polishing processes have been observed to remove material from over in wide feature definitions at higher removal rates as compared to material disposed over narrow feature definitions, the protrusion 400 of conductive material allows for planarization of the conductive material without dishing in the wide feature definitions and minimal or no residue formation over narrow feature definitions. An example of a copper polishing process is disclosed in U.S. patent application Ser. No. 10/025,144, filed on Dec. 18, 2001, and entitled "Method And Apparatus For Polishing Metal And Dielectric Substrates", now U.S. Pat No. 6,790,760, and an example of a barrier polishing process is disclosed in U.S. patent application Ser. No. 10/193,810, filed On Jul. 11, 2002, and entitled "Dual Reduced Agents For Barrier Removal In Chemical Mechanical Polishing", which are both incorporated herein to the extent not inconsistent with the claims aspects and disclosure herein.

The second polishing step may also be an electrochemical mechanical polishing step as described herein. The second electrochemical mechanical polishing step may be adapted to have material disposed on the substrate surface removed at higher removal rates over wide feature definitions as compared to the first polishing step or as compared to removal rates of material disposed over narrow feature definitions to provide for planarization of the conductive material. The relative removal rates of the second electrochemical mechanical polishing step may be adapted to be comparable to removal rate profiles observed in chemical mechanical polishing processes as described herein.

The removal rate profile of the second electrochemical mechanical polishing process to match chemical mechanical polishing techniques may be achieved by several approaches. In one example, a first electrochemical mechanical polishing step may have a greater amount of corrosion inhibitor or higher pH than a second electrochemical mechanical polishing step allowing for protrusion formation in the first electrochemical mechanical polishing step and no protrusion development in the second electrochemical mechanical polishing step. In another example, a pulse modulation technique for the second electrochemical mechanical polishing step may be used that increases removal rate over wide features as compared to a pulse modulation technique in the first electrochemical mechanical polishing step to control protrusion formation and relative removal rates. A combination of both pH and pulse modulation techniques may be used for both the first and second electrochemical mechanical polishing processes to provide the desired removal rate profiles to produce or remove protrusions as desired.

Additionally, when the second polishing step is a chemical mechanical polishing step, a composition for the chemical mechanical polishing process may be adapted to provide a desired profile for planarizing the substrate as described for the second electrochemical mechanical polishing step. For example, the chemical mechanical polishing process may have a lesser amount of corrosion inhibitor or lower pH than the electrochemical mechanical polishing step allowing for protrusion formation in the electrochemical mechanical polishing step and no protrusion development and/or protrusion removal in the chemical mechanical polishing step.

After conductive material and barrier material removal processing steps, the substrate may then be buffed to minimize surface defects. Buffing may be performed with a soft polishing article, i.e., a hardness of about 40 or less on the Shore D hardness scale as described and measured by the American Society for Testing and Materials (ASTM), headquartered in Philadelphia, Pa., at reduced polishing pressures, such as about 2 psi or less. An example of a suitable buffing process and composition is disclosed in co-pending U.S. patent application Ser. No. 09/569,968 (now abandoned), filed on May 11, 2000, and incorporated herein by reference to the extent not inconsistent with the invention.

Optionally, a cleaning solution may be applied to the substrate after each of the polishing process to remove particulate matter and spent reagents from the polishing process as well as help minimize metal residue deposition on the polishing articles and defects formed on a substrate surface. An example of a suitable cleaning solution is ElectraClean™ commercially available from Applied Materials, Inc., of Santa Clara, Calif.

Finally, the substrate may be exposed to a post polishing cleaning process to reduce defects formed during polishing or substrate handling. Such processes can minimize undesired oxidation or other defects in copper features formed on a substrate surface. An example of such a post polishing cleaning is the application of Electra Clean™, commercially available from Applied Materials, Inc., of Santa Clara, Calif.

It has been observed that substrate planarized by the processes described herein have exhibited reduced topographical defects, such as dishing, reduced residues, improved planarity, and improved substrate finish. The processes described herein may be further disclosed by the examples as follows.

EXAMPLES

The following non-limiting examples are provided to further illustrate embodiments of the invention. However, the examples are not intended to be all-inclusive and are not intended to limit the scope of the invention described herein.

Example 1

A copper plated substrate was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was exposed to a polishing composition of:

about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5; and
deionized water, and a polishing article was contacted with the substrate at about 0.2 psi at a bias of about 3 watts/volts was applied during the process. The substrate was polishing and examined. A protrusion height of about 4,000 Å was observed over wide feature definitions.

Example 2

A copper plated substrate was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was exposed to a polishing composition of:

about 6% by volume phosphoric acid;
about 2% by volume ethylenediamine;
about 2% by weight ammonium citrate;
about 0.3% by weight benzotriazole;
between about 2% and about 6% by volume of potassium hydroxide to provide a pH of about 5; and
deionized water, and a polishing article was contacted with the substrate at about 0.2 psi at a bias of about 3 watts/volts was applied by a pulse technique of 10 seconds on and 2 seconds off for 8 of cycles. The substrate was polishing and examined. A protrusion height of about 1,500 Å was observed over wide feature definitions.

While the foregoing is directed to embodiments of the present invention, other and further embodiments of the invention may be devised without departing from the basic scope thereof, and the scope thereof is determined by the claims that follow.

What is claimed is:

1. A method of processing a substrate having a layer of conductive material layer disposed thereon over narrow feature definitions and wide feature definitions, comprising:
   removing the conductive material disposed over narrow feature definitions at a higher removal rate than conductive material disposed over wide feature definitions by an electrochemical mechanical polishing technique to form a protrusion of the conductive material deposited over the wide feature definitions, wherein the protrusion of conductive material over the wide feature definitions comprises between about 1% and about 50% of the thickness of the deposited conductive material; and then
   removing the conductive material disposed over wide feature definitions at a removal rate greater than or equal to the removal rate of conductive material disposed over narrow feature definitions by at least a chemical mechanical polishing technique.

2. The method of claim 1, wherein the at least chemical mechanical polishing technique comprises a second electrochemical mechanical polishing technique.

3. The method of claim 2, wherein the electrochemical mechanical polishing technique comprises a first composition having a first concentration of corrosion inhibitor and the second electrochemical mechanical polishing technique comprises a second composition having a second concentration of corrosion inhibitor less than the first concentration of corrosion inhibitor.

4. The method of claim 3, wherein the first concentration of corrosion inhibitor comprises about 3 wt. % or greater of corrosion inhibitor and the second concentration of corrosion inhibitor comprises about less than about 3 wt. % of corrosion inhibitor.

5. The method of claim 3, wherein the corrosion inhibitor has one or more azole groups and is selected from the group consisting of benzotriazole, imidazole, benzimidazole, triazole, and derivatives of benzotriazole, imidazole, benzimidazole, triazole, with hydroxy, amino, imino, carboxy, mercapto, nitro and alkyl substituted groups and combinations thereof.

6. The method of claim 2, wherein the electrochemical mechanical polishing technique comprises a first composition having a first pH and the second electrochemical mechanical polishing technique comprises a second composition having a second pH less than the first pH.

7. The method of claim 6, wherein the first pH is about 6.5 and the second pH is about 4.5.

8. A method of processing a substrate having a substrate surface comprising a layer of conductive material deposited over narrow feature definitions and wide feature definitions with the layer of conductive material having a first overburden over the narrow feature definitions and a second overburden less than the first overburden over the wide feature definitions the method comprising:
   polishing the substrate by an electrochemical polishing process comprising:
      providing the substrate to a process apparatus comprising a first electrode and a second electrode with the substrate in electrical contact with the second electrode;
      supplying a polishing composition between the first electrode and the substrate, wherein the polishing composition comprises:
         an acid based electrolyte system;
         one or more chelating agents having one or more amine functional groups, one or more amide functional groups, or combinations thereof;
         greater than about 0.2 wt. % of one or more corrosion inhibitors;
         one or more inorganic or organic acid salts;
         one or more base pH adjusting agents to provide a pH between greater than about 4.5 and about 7; and
         a solvent, wherein the polishing composition forms a passivation layer on the conductive material;
      abrading the passivation layer to expose a portion of the conductive material;
      applying a bias between the first electrode and the second electrode;
      removing the conductive material disposed over narrow feature definitions at a higher removal rate than the conductive material disposed over wide feature definitions to form a protrusion of the conductive material deposited over the wide feature definitions, wherein the protrusion of conductive material over the wide feature definitions comprises between about 1% and about 50% of the thickness of the deposited conductive material; and
   polishing the substrate by at least a chemical mechanical polishing process to remove the remaining conductive material.

9. The method of claim 8, wherein the protrusion of conductive material over the wide feature definitions comprises between about 20% and about 40% of the thickness of the deposited conductive material.

10. The method of claim 8, wherein the bias is applied to a substrate at a current density between about 0.01 milliamps/cm$^2$ and about 100 milliamps/cm$^2$.

11. The method of claim 10, wherein the bias is applied by a pulse modulation technique.

12. The method of claim 11, wherein the pulse modulation technique and the polishing composition are adapted to form a protrusion of conductive material deposited over the wide feature definition.

13. The method of claim 8, wherein the one or more corrosion inhibitors comprise between greater than about 0.2 wt. % and about 1.0 wt. % of the composition.

14. The method of claim 9, wherein the protrusion comprises between about 20% and about 30% of a thickness of a deposited conductive material.

15. The method of claim 13, wherein the composition further comprises:
between about 1% and about 30% by weight (wt. %) of one or more acid based electrolytes in the total volume of solution;
between about 0.1% and about 15% by volume or weight of the one or more chelating agents in the total volume of solution;
between about 0.1% and about 15% by volume or weight of the one or more inorganic or organic acid salts in the total volume of solution;
between about 0.1% and about 25% by volume or weight of the base pH adjusting agent in the total volume of solution to establish a pH between greater than about 4.5 and about 7; and
the remainder a solvent.

16. The method of claim 15, wherein the composition comprises:
about 6% by volume phosphoric acid;
about 2% by volume ethylenediamine;
about 0.3% by weight benzotriazole;
about 2% by weight ammonium citrate;
between about 2% and about 6% by volume of potassium hydroxide to provide a pH of about 5; and
deionized water.

17. The method of claim 8, wherein abrading the passivation layer comprises applying a contact pressure between about 0.01 psi and about 1 psi between the substrate and a polishing article and providing relative motion between the substrate and the polishing article.

18. The method of claim 8, wherein the at least chemical mechanical polishing process removes conductive material disposed over wide feature definitions at a higher removal rate than conductive material disposed over narrow feature definitions.

19. The method of claim 8, wherein the electrochemical mechanical polishing process is performed on a first platen and the chemical mechanical polishing technique is performed on a second platen.

20. The method of claim 8, wherein the polishing the substrate by at least a chemical mechanical polishing process comprises a second electrochemical mechanical polishing process.

21. The method of claim 20, wherein the first electrochemical mechanical polishing process is performed on a first platen and the second electrochemical mechanical polishing process is performed on a second platen.

22. The method of claim 20, wherein the first electrochemical mechanical polishing process has a composition comprising about 0.3 wt. % of benzotriazole and the second electrochemical mechanical polishing technique has a composition comprising about 0.2 wt. % of benzotriazole.

23. The method of claim 20, wherein the first electrochemical mechanical polishing process has a composition comprising a pH of about 6.5 and the second electrochemical mechanical polishing technique has a composition comprising a pH of about 4.5.

24. A method of processing a substrate having a substrate surface comprising a layer of conductive material deposited over narrow feature definitions and wide feature definitions with the layer of conductive material having a first overburden over the narrow feature definitions and a second overburden less than the first overburden over the wide feature definitions, the method comprising:
polishing the substrate by an electrochemical polishing process comprising:
providing the substrate to a process apparatus comprising a first electrode and a second electrode with the substrate in electrical contact with the second electrode;
supplying a polishing composition between the first electrode and the substrate, wherein the polishing composition forms a passivation layer on the conductive material;
abrading the passivation layer to expose a portion of the conductive material;
applying power by a pulse modulation technique between the first electrode and the second electrode to remove the conductive material disposed over narrow feature definitions at a higher removal rate than the conductive material disposed over wide feature definitions to form a protrusion of the conductive material deposited over the wide feature definitions, wherein the protrusion of conductive material over the wide feature definitions comprises between about 1% and about 50% of the thickness of the deposited conductive material; and
polishing the substrate by at least a chemical mechanical polishing process to remove the remaining conductive material.

25. The method of claim 24, wherein the pulse modulation technique forms a protrusion between about 20% and about 40% of a thickness of the deposited conductive material over the wide feature definition.

26. The method of claim 24, wherein the pulse modulation technique comprises one or more cycles of applying a power for a limited duration of time and not applying power for a limited period of time.

27. The method of claim 26, wherein the pulse modulation technique applies a power sufficient to provide a current density up to about 100 milliamps/cm$^2$.

28. The method of claim 26, wherein the pulse modulation technique comprises one or more cycles of applying a power between about 2 seconds and about 25 seconds and not applying power between about 2 seconds and about 25 seconds.

29. The method of claim 20, wherein the pulse modulation technique comprises applying a power for between about 16% and about 66% of each cycle.

30. The method of claim 24, wherein the polishing composition comprises:
an acid based electrolyte system;
one or more chelating agents having one or more amine functional groups, one or more amide functional groups, or combinations thereof;
greater than about 0.2 wt. % of one or more corrosion inhibitors;
one or more inorganic or organic acid salts;
one or more base pH adjusting agents to provide a pH between greater than about 4.5 and about 7; and
a solvent, wherein the polishing composition forms a passivation layer on exposed conductive material.

31. The method of claim 24, wherein abrading the passivation layer comprises applying a contact pressure between about 0.01 psi and about 1 psi between the substrate and a polishing article and providing relative motion between the substrate and the polishing article.

32. The method of claim 24, wherein the at least chemical mechanical polishing process removes conductive material disposed over wide feature definitions at a higher removal rate than conductive material disposed over narrow feature definitions.

33. The method of claim 24, wherein the electrochemical mechanical polishing process is performed on a first platen and the chemical mechanical polishing technique is performed on a second platen.

34. The method of claim 24, wherein the polishing the substrate by at least a chemical mechanical polishing process comprises a second electrochemical mechanical polishing process.

* * * * *

UNITED STATES PATENT AND TRADEMARK OFFICE
CERTIFICATE OF CORRECTION

PATENT NO. : 7,160,432 B2
APPLICATION NO. : 10/608404
DATED : January 9, 2007
INVENTOR(S) : Liu et al.

It is certified that error appears in the above-identified patent and that said Letters Patent is hereby corrected as shown below:

Two Page, Item (56), U.S. PATENT DOCUMENTS: Please include the following references:

| | | |
|---|---|---|
| --4,934,102 | 06/1990 | Edson |
| 6,106,728 | 09/2000 | Kondo et al. |
| 6,402,925 | 06/2002 | Talieh |
| 6,582,579 | 06/2003 | Uzho |
| 6,821,409 | 11/2004 | Basol et al. |
| 6,852,630 | 02/2005 | Basol et al. |
| 6,867,136 | 03/2005 | Basol et al. |
| 6,902,659 | 06/2005 | Talieh |
| 6,943,112 | 09/2005 | Basol et al. |
| 6,946,068 | 09/2005 | Basol et al. |
| 2003/0038038 | 02/2003 | Basol et al. |
| 2003/0119311 | 06/2003 | Basol et al. |
| 2004/0231994 | 11/2004 | Basol et al. |
| 2005/0227483 | 10/2005 | Basol et al. |
| 2006/0009033 | 06/2006 | Basol et al. |
| 2006/0011485 | 01/2006 | Basol et al. |
| 2006/0006074 | 01/2006 | Liu et el.-- |

Title Page, Item (56), FOREIGN PATENT DOCUMENTS: Please include the following references:

--EP 1,410,430
WO 03/009361
WO 03/087436
WO 03/088316--

Title Page, Item (56), OTHER PUBLICATIONS: Please include the following reference:

--PCT IPRP and Written Opinion dated December 22, 2005. (APPM/005699PC03)--

Column 2, Line 10: Before "high", delete "and"

Column 9, Line 7: After "2001," insert --now U.S. Pat. No. 7,066,800--

Column 15, Line 27: After "2002," insert --now U.S. Pat. No. 6,863,797--

UNITED STATES PATENT AND TRADEMARK OFFICE
CERTIFICATE OF CORRECTION

PATENT NO. : 7,160,432 B2
APPLICATION NO. : 10/608404
DATED : January 9, 2007
INVENTOR(S) : Liu et al.

It is certified that error appears in the above-identified patent and that said Letters Patent is hereby corrected as shown below:

Column 21, Line 11: Change "6,790,760" to --6,790,768--

Column 21, Line 15: Before "which", insert --now U.S. Pat. No. 7,008,554,--

Column 24, Claim 8, Line 7: insert a comma after "definitions"

Column 26, Claim 29, Line 43: Change "20" to --26--

Signed and Sealed this

Twenty-ninth Day of May, 2007

JON W. DUDAS
*Director of the United States Patent and Trademark Office*